United States Patent [19]
Rearick

[11] Patent Number: 6,088,226
[45] Date of Patent: Jul. 11, 2000

[54] MULTIPLE-COMPONENT CLAMP AND RELATED METHOD FOR ATTACHING MULTIPLE HEAT-GENERATING COMPONENTS TO A HEATSINK

[75] Inventor: Donald P. Rearick, Rowlett, Tex.

[73] Assignee: Lucent Technologies, Inc., Murray Hill, N.J.

[21] Appl. No.: 09/281,848

[22] Filed: Mar. 31, 1999

[51] Int. Cl.[7] .................................................. H05K 7/20
[52] U.S. Cl. ...................... 361/704; 361/707; 361/709; 361/713; 361/717; 361/718; 361/719; 257/717; 257/718; 257/719; 165/80.2
[58] Field of Search .................................. 361/704, 707, 361/709, 710, 717–720; 257/718, 719, 727; 174/16.1, 16.3; 165/30.2, 30.3

[56] References Cited

U.S. PATENT DOCUMENTS

| | | | |
|---|---|---|---|
| 4,658,331 | 4/1987 | Berg | 361/705 |
| 4,887,149 | 12/1989 | Romano' | 257/718 |
| 5,307,236 | 4/1994 | Rio et al. | 361/720 |
| 5,450,284 | 9/1995 | Wekell | 361/710 |
| 5,483,103 | 1/1996 | Blickhan et al. | 257/718 |
| 5,648,889 | 7/1997 | Bosli | 361/704 |
| 5,825,088 | 10/1998 | Bartlow | 257/712 |
| 5,883,782 | 3/1999 | Thurston et al. | 361/719 |
| 5,896,270 | 4/1999 | Tsui | 361/704 |

*Primary Examiner*—Leo P. Picard
*Assistant Examiner*—Boris L. Chervinsky

[57] ABSTRACT

The present invention provides a multiple-component clamp for use with multiple, heat-generating components and a heatsink. In one embodiment, the multiple-component clamp comprises a clamp body having first and second regions, and a deformable region positioned between the first and second regions. The deformable region allows the clamp body to adjust to a thickness of at least one of the heat-generating components to thereby provide substantially even clamping forces against each of the heat-generating components when the multiple-component clamp is affixed to the heatsink.

10 Claims, 7 Drawing Sheets

MULTIPLE-COMPONENT CLAMP AND RELATED METHOD FOR ATTACHING MULTIPLE HEAT-GENERATING COMPONENTS TO A HEATSINK

TECHNICAL FIELD OF THE INVENTION

The present invention is directed, in general, to a multiple-component clamp and, more specifically, to a one piece, multiple-component clamp for attaching multiple, heat-generating components to a heatsink.

BACKGROUND OF THE INVENTION

Today more than ever before, electronics designers must pack higher powered components closer together in ever-smaller spaces. More power in less space translates to increased power densities, and higher device operating temperatures, thereby requiring increased heat dissipation. As temperatures rise, the reliability and functionality of electronic components are impaired dramatically. Experience has shown that more than 50 percent of electronic failures are the result of thermal problems. Traditionally, heatsinks are used to transfer heat from components generating the heat to an area where the heat can be dissipated (such as the atmosphere) or adequate ventilation is provided to remove the heat from the heatsink.

Most conventional heatsinks use some form of mechanical method to attach the heat-generating component to the heatsink. The most common methods are: adhesives, spring clamping devices, or holddown brackets/clamps with a mechanical fastener, such as a machine screw. Adhesives have well known disadvantages associated with storage and handling. In those cases not employing adhesives, the heatsinks are usually made of two pieces: a main heatsink body, and a separate retaining clamp. The clamp is usually secured to the main body by a machine screw or stud and nut.

Figure 1A:
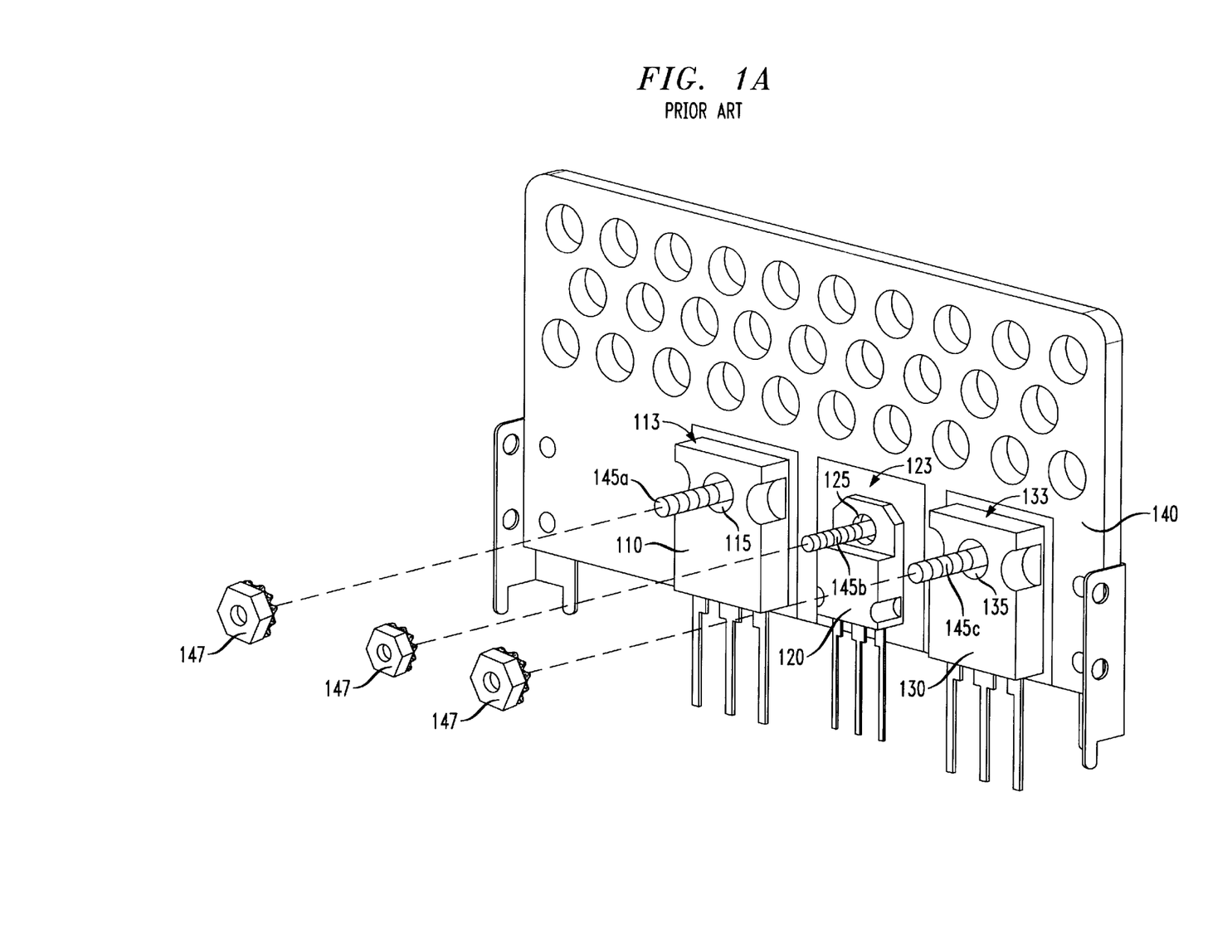
FIG. 1A illustrates an exploded isometric view of a conventional approach to mounting multiple components to a heatsink.

Special problems arise when multiple components, such as field effect transistors (FETs) and diodes, are attached to a single heatsink. Referring initially to FIG. 1A, illustrated is an exploded isometric view of one example of a conventional approach to mounting multiple components to a single heatsink. In this approach, mounting apertures 115, 125, 135 of three individual components 110, 120, 130, respectively, are located as provided by their manufacturer(s) near the top 113, 123, 133 of each component 110, 120, 130. First, second and third threaded mounting studs 145a, 145b, 145c may be mounted on a conventional heatsink 140 such that the threaded mounting studs 145a, 145b, 145c may be passed through the individual mounting apertures 115, 125, 135. In an alternative embodiment, the threaded mounting studs 145a, 145b, 145c may be replaced with machine screws (not shown). The components 110, 120, 130 are secured with hex nuts 147.

One skilled in the art will readily recognize that a mounting force applied to the mounting apertures 115, 125, 135 located near the top 113, 123, 133 of the components 110, 120, 130 will not apply uniform mounting pressure to the components 110, 120, 130, thus increasing interfacial thermal resistance. Plastic washers (not shown) are optionally needed in many cases to electrically isolate the mounting studs 145a, 145b, 145c. Also, when the components 110, 120, 130 are used on a primary circuit board (not shown) of a power unit, arcing can occur between the component mounting apertures 115, 125, 135 surface and the mounting studs 145a, 145b, 145c or heatsink 140 due to the high voltage potential and the small spacing distance.

Figure 1B:
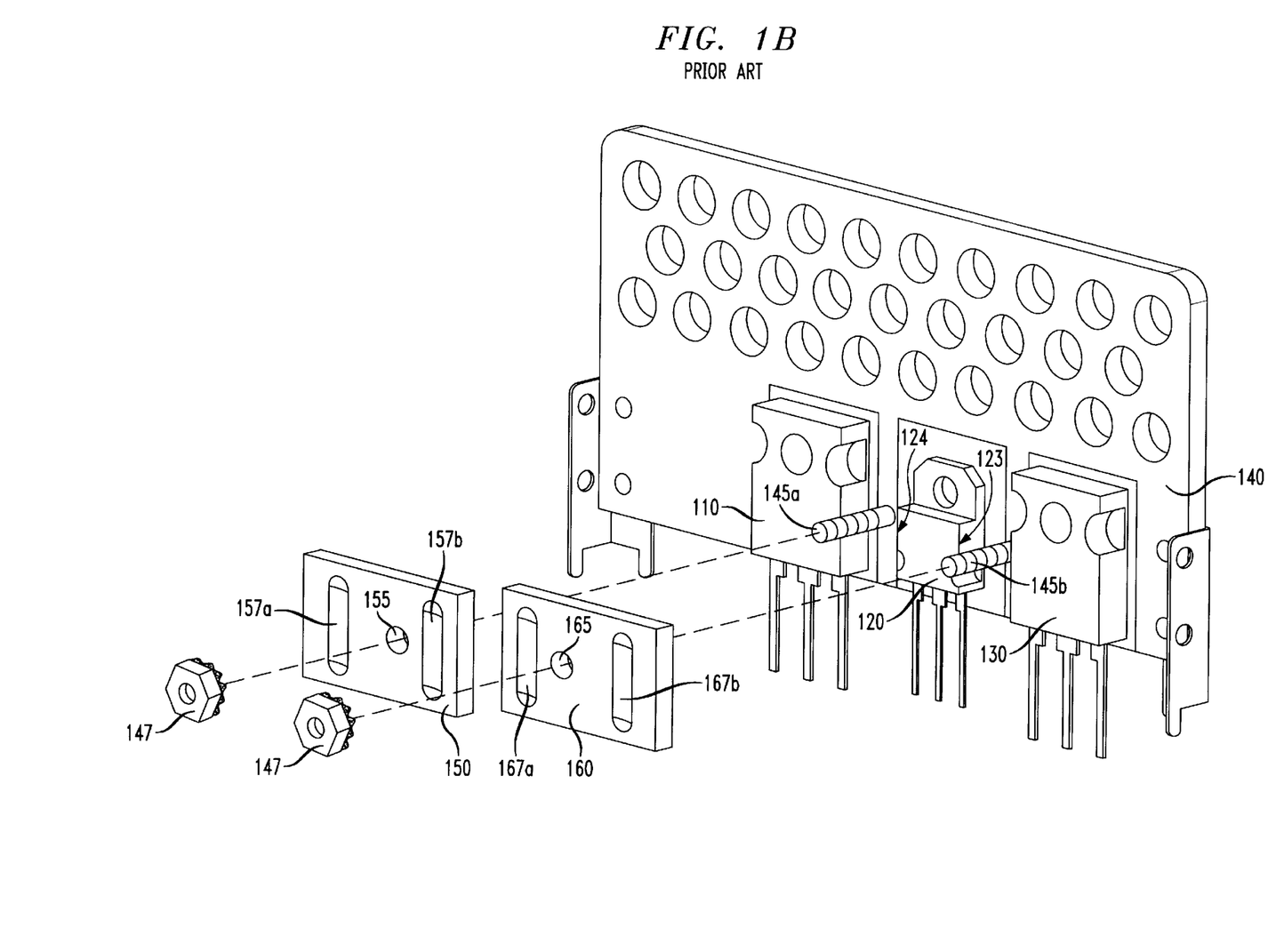
FIG. 1B illustrates an exploded isometric view of a conventional system for mounting three heat-generating components to a heatsink.

An alternative conventional system for mounting three heat-generating components is illustrated in FIG. 1B. Rather than mounting each component 110, 120, 130 individually as in FIG. 1A, two non-symmetrical brackets 150, 160 clamp the first, second and third components 110, 120, 130 to the heatsink 140. The non-symmetrical brackets 150, 160 include bracket mounting apertures 155, 165 that cooperate with the threaded mounting studs 145a, 145b and hex nuts 147 to secure the components 110, 120, 130 to the heatsink 140. The non-symmetrical brackets 150, 160 further include raised bosses 157a, 157b, 167a, 167b (toward the components 110, 120, 130) designed to make contact with the components 110, 120, 130. This approach does not work well when the center component 120 is small, e.g., a TO220 (JEDEC outline) package size in relation to the end (first and third) components 110, 130. The raised bosses 157b, 167b may miss the component 120 or strike an edge 123, 124 of the component 120 cracking the component housing and causing component failure. Of course, the components 110, 120, 130 might be relocated to achieve a better clamping profile. That would, however, require redesign of the circuit traces on a printed wiring board (not shown) at a significant cost.

Figure 1C:
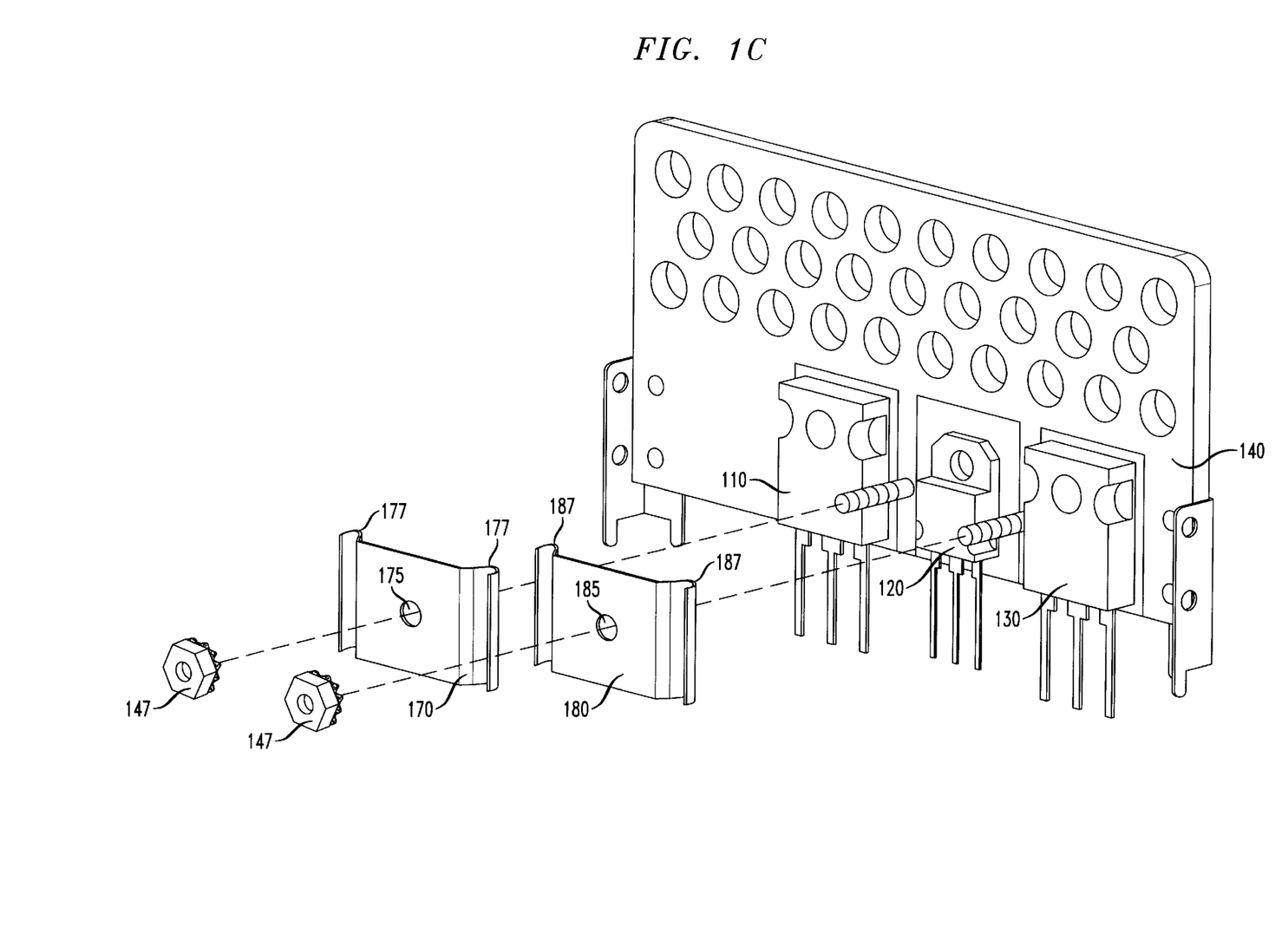
FIG. 1C illustrates an exploded isometric view of another conventional approach for mounting three heat-generating components to a heatsink.

A third conventional approach for mounting three heat-generating components is illustrated in FIG. 1C. In this instance, two spring steel clamps 170, 180 include mounting apertures 175, 185 therethrough and projections 177, 187. This approach accommodates the varying thicknesses of the components 110, 120, 130, but has a limitation on a clamping force that may be exerted on the components 110, 120, 130. It is well known in the art that increasing the contact pressure (clamping force) decreases the interfacial thermal resistance between the components 110, 120, 130 and the heatsink 140. Clamps 170, 180 of this type are well known to deform under the pressure exerted during torquing of the nuts 147.

Thus, the aforementioned and other currently existing clamp assemblies have not been able to adequately accommodate multiple components for attachment to a heatsink. Accordingly, what is needed in the art is a low-cost, easy-to-manufacture, and easy-to-assemble clamp that facilitates attachment of multiple and, in many instances, different size components to a single heatsink.

SUMMARY OF THE INVENTION

To address the above-discussed deficiencies of the prior art, the present invention provides a multiple-component clamp for use with multiple, heat-generating components and a heatsink. In one embodiment, the multiple-component clamp includes a clamp body having first and second regions, and a deformable region positioned between the first and second regions. The deformable region allows the clamp body to adjust to a thickness of at least one of the heat-generating components to thereby provide substantially even clamping forces against each of the heat-generating components when the multiple-component clamp is affixed to the heatsink.

In an alternative embodiment, the multiple component clamp is an essentially flat, rectangular plate having first and second long edges, with the first and second long edges having first and second midpoints, respectively; the deformable region being formed between the midpoints. The deformable region, in another embodiment, may include a flute in a surface of the rectangular plate and extending between the first and second long edges.

In still another embodiment, the deformable region may further include first and second notches in the first and second long edges. In a preferred embodiment, the clamp body is a channel having first and second flanges along first and second long edges thereof. A variation of this embodiment may include a deformable region having first and second notches formed in the first and second flanges. The first and second regions, in another embodiment, may further include first and second mounting apertures therethrough, respectively; the first and second mounting apertures configured to cooperate with heatsink studs mounted on the heatsink. In an alternative embodiment, the first and second regions may further include first and second mounting studs projecting therefrom, respectively; the first and second mounting studs being configured to cooperate with heatsink apertures in the heatsink. In yet another embodiment, the first and second regions further include a front face and a rear face; the rear face having bosses projecting therefrom. The multiple component clamp, in a preferred embodiment, includes a deformable region that is ductile. In other alternative embodiments, the multiple component clamp may be formed of steel, stainless steel or aluminum.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 2A:
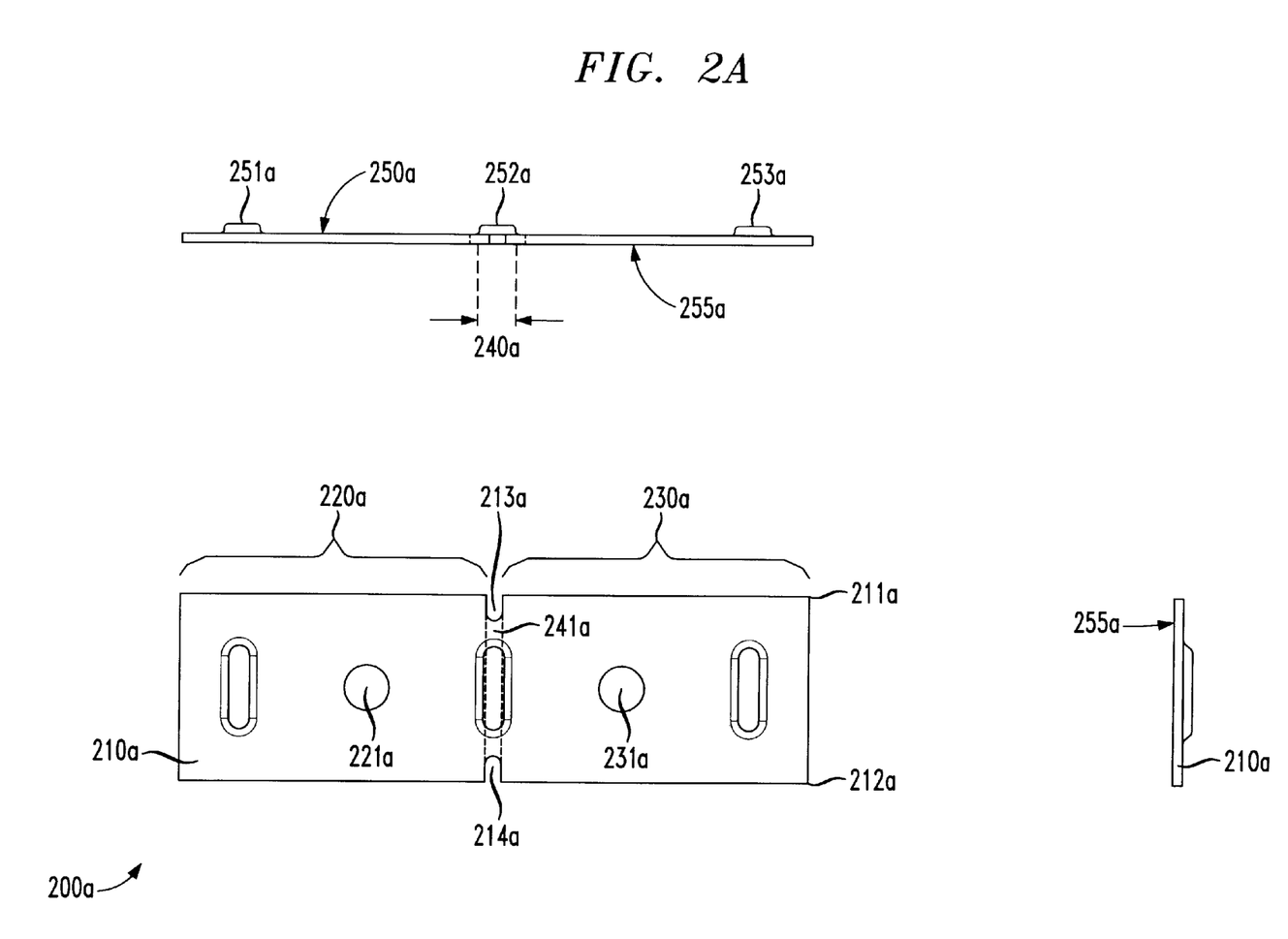
FIG. 2A illustrates a three view drawing of one embodiment of a multiple-component clamp constructed according to the principles of the present invention.

Referring now to FIG. 2A, illustrated is a three view drawing of one embodiment of a multiple-component clamp constructed according to the principles of the present invention. A multiple-component clamp 200a comprises an essentially flat, rectangular plate 210a, divided into first and second regions 220a, 230a and a deformable region 240a. The first and second regions 220a, 230a have respective first and second mounting apertures 221a, 231a therethrough. The deformable region 240a may be formed in a variety of ways, e.g., a flute 241a is shown in a front face 255a of the multiple-component clamp 200a. Optional notches 213a, 214a may be formed in long edges 211a, 212a of the rectangular plate 210a. The multiple-component clamp 200a may further comprise a plurality of bosses 251a, 252a, 253a formed in a rear face 250a of the first and second regions 220a, 230a and at the deformable region 240a.

Figure 2B:
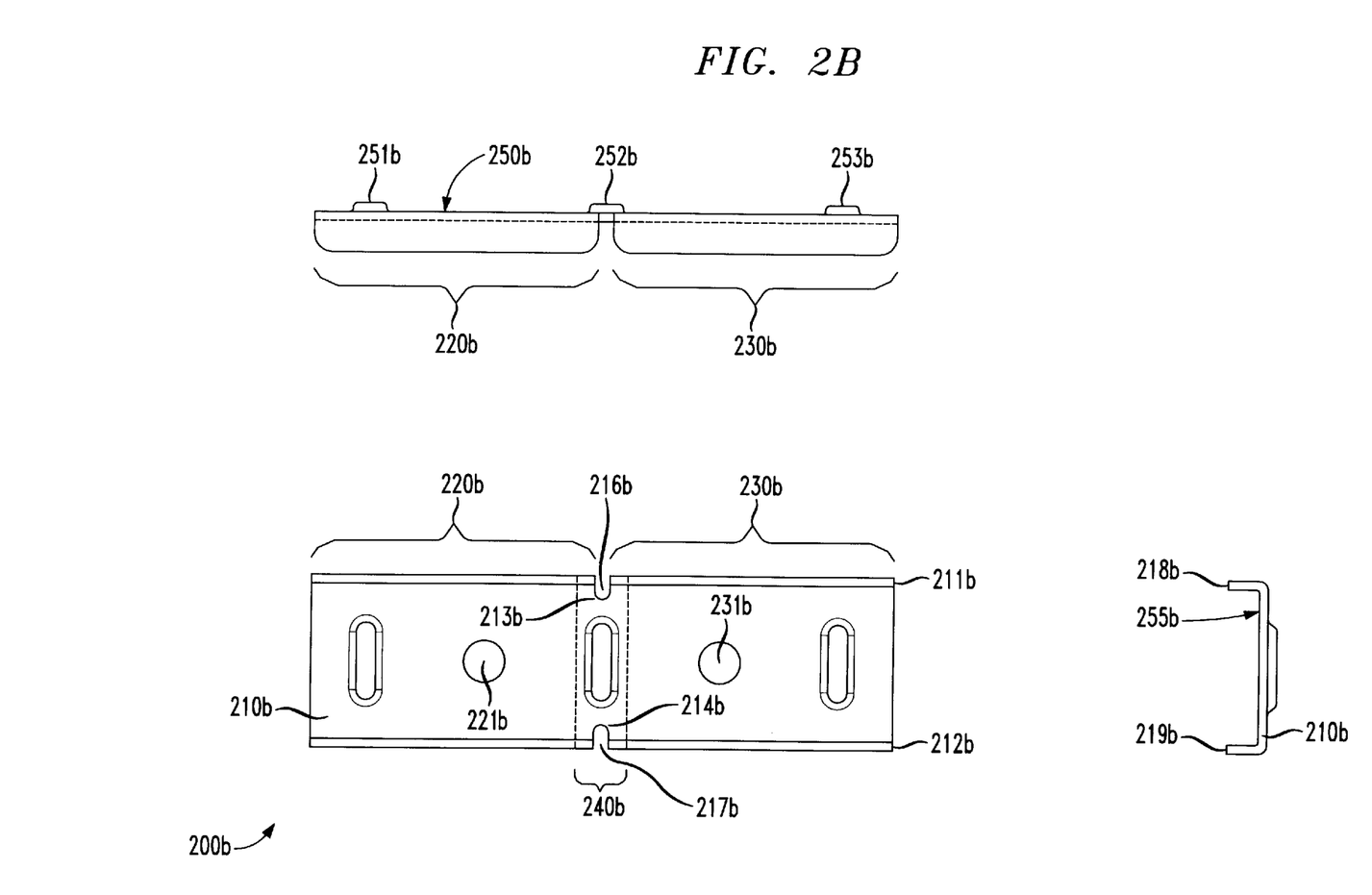
FIG. 2B illustrates a three view drawing of an alternative embodiment of the multiple-component clamp of FIG. 2A.

Referring now to FIG. 2B, illustrated is a three view drawing of an alternative embodiment of the multiple-component clamp of FIG. 2A. In a preferred embodiment, the multiple component clamp 200b includes a clamp body 210b formed as a rectangular channel divided into first and second regions 220b, 230b and a deformable region 240b. The channel 210b may be formed of steel, stainless steel, aluminum, or other suitable ductile material. The first and second regions 220b, 230b have respective first and second mounting apertures 221b, 231b therethrough. The deformable region 240b may be formed in a variety of ways so as to be ductile.

In the illustrated embodiment, first and second notches 213b, 214b have been formed at approximately the midpoints 216b, 217b of flanges 218b, 219b along first and second long edges 211b, 212b of the rectangular channel 210b, forming the deformable region 240b. The deformable region 240b may be formed in an inner face 255b of the channel 210b between the midpoints 216b, 217b as in FIG. 2A. A plurality of bosses 251b, 252b, 253b have also been formed in a rear face 250b of the first and second regions 220b, 230 and at the deformable region 240b.

Of course, one skilled in the art will recognize that various combinations of the deformable region, e.g., flute, notches, etc., and bosses may be combined with the flat plate to create other variants of the present invention. It should also be noted that the multiple component clamp 200a or 200b, which may be referred to hereafter as 200, may also include more than two regions, thus accommodating more than three heat-generating components.

Figure 3:
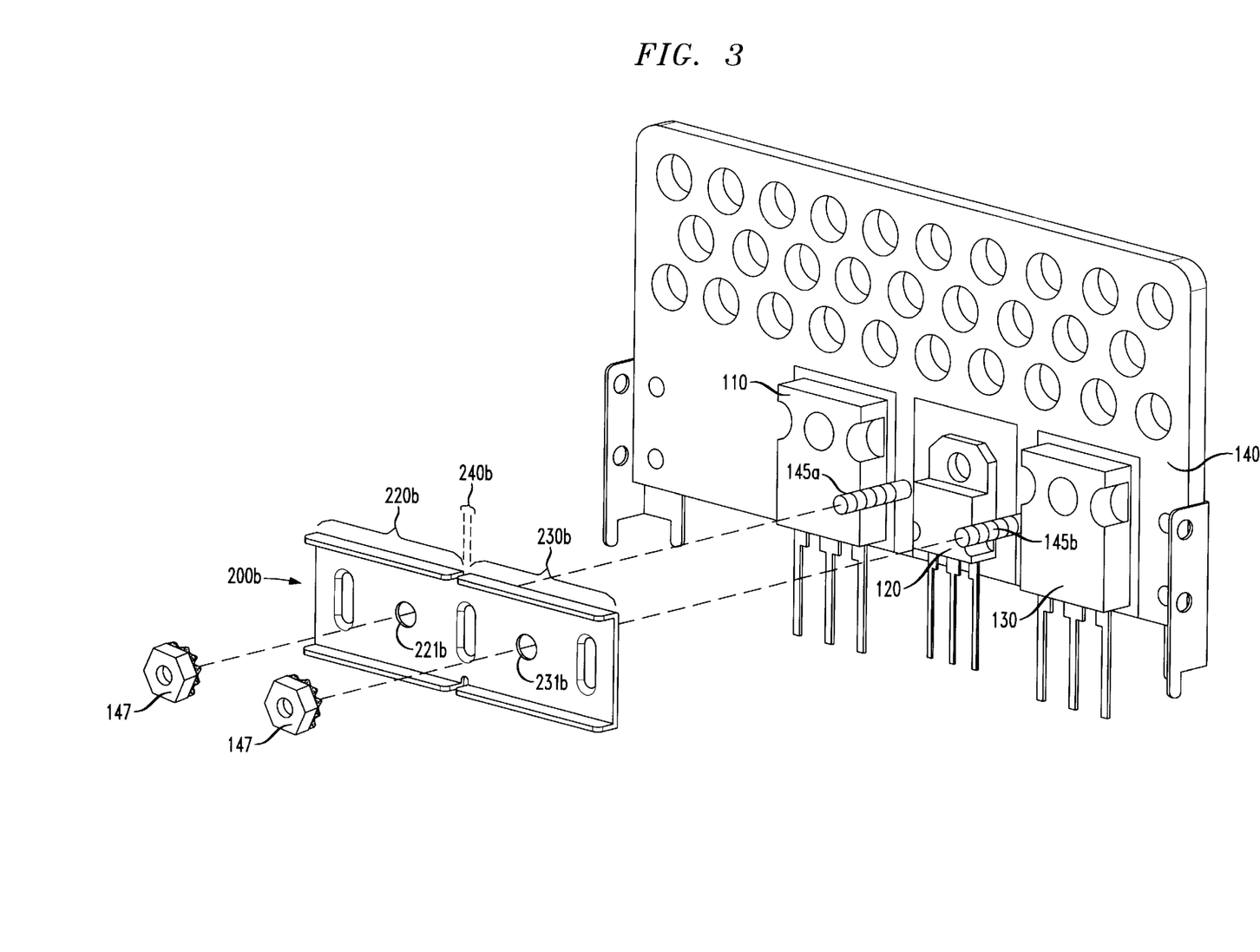
FIG. 3 illustrates an exploded isometric view of the multiple-component clamp of FIG. 2 with the multiple components and heatsink of FIG. 1A.

Referring now to FIG. 3, illustrated is an exploded isometric view of the multiple-component clamp of FIG. 2B with the multiple components 110, 120, 130 and heatsink 140 of FIG. 1A. The first and second mounting apertures 221b, 231b are configured to accept first and second mounting studs 145a, 145b therethrough. When in place over the heat-generating components 110, 120, 130, the first and second regions 220b, 230b remain connected, yet the deformable region 240b will deform under pressure from first and second securing nuts 147. As the deformable region 240b deforms, the bosses 251b, 252b, 253b selectively contact and hold the heat-generating components 110, 120, 130 with a nearly uniform clamping force across the components 110, 120, 130 when the securing nuts 147 are applied to the mounting studs 145a, 145b. Thus, damage to the components 110, 120, 130 is prevented by uniformly spreading the clamping force to the components 110, 120, 130.

Figure 4:
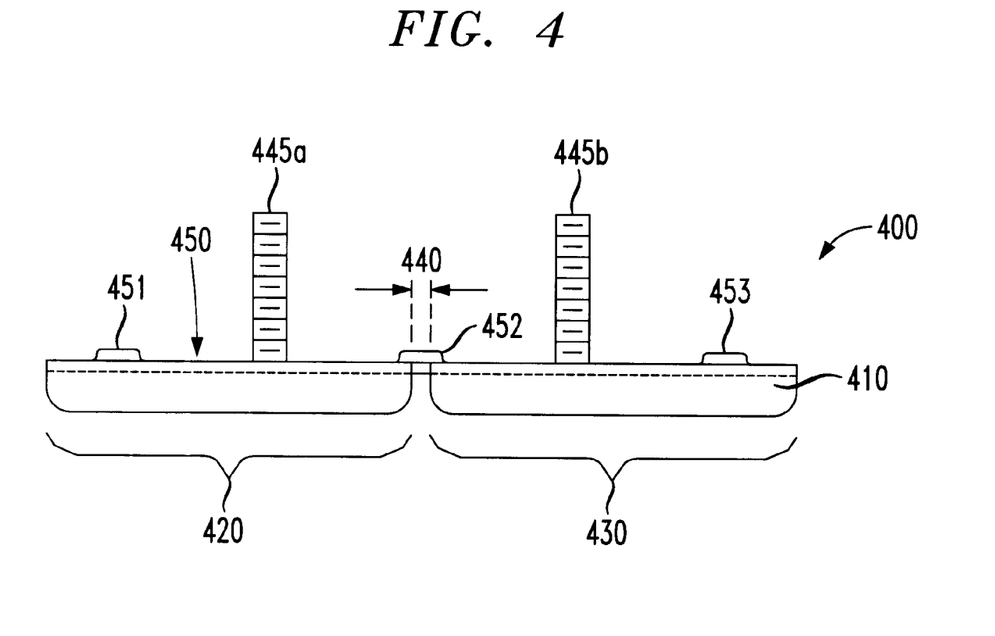
FIG. 4 illustrates a side view drawing of an alternative embodiment of the multiple-component clamp of FIG. 2.

Referring now to FIG. 4, illustrated is a side view drawing of an alternative embodiment of the multiple-component clamp of FIG. 2. In this embodiment, a multiple-component clamp 400 includes a clamp body 410 formed as a rectangular channel and divided into first and second regions 420, 430 and a deformable region 440. The clamp 400 further includes bosses 451, 452, 453 and mounting studs 445a, 445b projecting from a rear face 450. One who is skilled in the art will readily perceive how the mounting studs 445a, 445b cooperate with corresponding mounting apertures (not shown) of a heatsink. Of course, one skilled in the art will readily conceive of other mounting methods that may likewise be employed for affixing the clamp 200 or 400 to the heatsink, e.g., threaded or non-threaded posts coupled with spring steel nuts, such as Pal nuts®, etc. All such mechanical mounting methods are considered applicable to and within the broadest scope of the present invention.

Thus, a multiple-component clamp 200 has been described that prevents damage to the heat-generating components 110, 120, 130, yet accommodates different sizes of components. The clamp 200 further simplifies installation as only the one-piece clamp is held while installing the components 110, 120, 130 and securing nuts 147. The clamp 200 also applies pressure more uniformly to the multiple components 110, 120, 130, and permits adequate securing force to be applied to the securing nuts 147 without the clamp 200 deforming.

Although the present invention has been described in detail, those skilled in the art should understand that they can make various changes, substitutions and alterations herein without departing from the spirit and scope of the invention in its broadest form.

What is claimed is:

1. For mounting multiple heat-generating components to a heatsink, a multiple-component clamp, comprising:

a clamp body having first and second regions, said clamp body being an essentially rectangular plate having first and second long edges with first and second midpoints, respectively, each of said first and second regions adapted to engage at least one of said multiple heat-generating components; and a deformable region, positioned between said first and second midpoints, that allows said clamp body to adjust to a thickness of at least one of said heat-generating components to thereby provide substantially even clamping forces against each of said heat-generating components when said multiple-component clamp is affixed to said heatsink.

2. The multiple-component clamp as recited in claim 1 wherein said deformable region comprises a flute in a surface of said rectangular plate extending between said first and second long edges.

3. The multiple-component clamp as recited in claim 1 wherein said deformable region comprises first and second notches.

4. The multiple-component clamp as recited in claim 1 wherein said clamp body is a channel having first and second flanges along said first and second long edges, respectively.

5. The multiple-component clamp as recited in claim 4 wherein said deformable region comprises first and second notches formed in said first and second flanges.

6. The multiple-component clamp as recited in claim 1 wherein said first and second regions further comprise first and second mounting apertures therethrough, respectively, said first and second mounting apertures configured to cooperate with heatsink studs mounted on said heatsink.

7. The multiple-component clamp as recited in claim 1 wherein said first and second regions further comprise first and second mounting studs projecting therefrom, respectively, said first and second mounting studs configured to cooperate with heatsink apertures in said heatsink.

8. The multiple-component clamp as recited in claim 1 wherein said first and second regions further comprise front and rear faces, said rear face having bosses projecting therefrom.

9. The multiple-component clamp as recited in claim 1 wherein said deformable region is ductile.

10. The multiple-component clamp as recited in claim 1 wherein said multiple-component clamp is formed of a metal selected from the group consisting of:

steel;

stainless steel; and aluminum.

\* \* \* \* \*